(12) United States Patent
Mitsuishi et al.

(10) Patent No.: US 7,106,515 B2
(45) Date of Patent: Sep. 12, 2006

(54) COMPOSITION FOR VAPOR DEPOSITION, METHOD FOR FORMING AN ANTIREFLECTION FILM, AND OPTICAL ELEMENT

(75) Inventors: Takeshi Mitsuishi, Tokyo (JP); Hitoshi Kamura, Tokyo (JP); Kenichi Shinde, Tokyo (JP); Hiroki Takei, Tokyo (JP); Akinori Kobayashi, Tokyo (JP); Yukihiro Takahashi, Tokyo (JP); Yuko Watanabe, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/986,907

(22) Filed: Nov. 13, 2001

(65) Prior Publication Data

US 2002/0089751 A1     Jul. 11, 2002

(30) Foreign Application Priority Data

Nov. 13, 2000   (JP)  .............................. 2000-344928
Apr. 25, 2001   (JP)  .............................. 2001-128157

(51) Int. Cl.
*G01B 1/10*   (2006.01)

(52) U.S. Cl. ..................................... 359/580

(58) Field of Classification Search ............... 359/580, 359/581, 582; 428/447, 446, 448
See application file for complete search history.

(56) References Cited

U.S. PATENT DOCUMENTS

| | | | | |
|---|---|---|---|---|
| 4,116,717 A * | 9/1978 | Rahilly | ........................ | 136/255 |
| 4,161,560 A * | 7/1979 | Kienel | ........................ | 351/166 |
| 4,246,043 A * | 1/1981 | Lindmayer | .................. | 136/256 |
| 5,116,644 A * | 5/1992 | Asai et al. | .................. | 427/164 |
| 5,181,141 A | 1/1993 | Sato et al. | ................... | 359/580 |
| 5,372,874 A | 12/1994 | Dickey et al. | | |
| 5,579,162 A * | 11/1996 | Bjornard et al. | ........ | 204/192.26 |
| 5,846,649 A * | 12/1998 | Knapp et al. | ................ | 428/334 |
| 6,306,513 B1 | 10/2001 | Itoh et al. | .................... | 428/447 |
| 6,387,517 B1 * | 5/2002 | Belleville et al. | ......... | 106/286.2 |
| 6,436,541 B1 * | 8/2002 | Sopko et al. | ............... | 359/359 |

FOREIGN PATENT DOCUMENTS

| | | |
|---|---|---|
| EP | 0 390 218 | 10/1990 |
| JP | 56-116003 | 9/1981 |
| JP | 59-148002 | 8/1984 |
| JP | 59-154401 | 9/1984 |
| JP | 02-291501 | 3/1990 |
| JP | 02-291502 | 3/1990 |

OTHER PUBLICATIONS

Copending U.S. Appl. No. 09/995,827.
Guo, Xin et al., "Effect of Niobia on the Defect Structure of Yttria-stablized Zirconia," Journal of the European Ceramic Society 18, No. 3 (1998), pp. 237-240.
European Search Report for Counterpart Foreign Application No. EP 1 205 774 A3 dated Apr. 14, 2004.

* cited by examiner

*Primary Examiner*—Drew A. Dunn
*Assistant Examiner*—Joshua L. Pritchett
(74) *Attorney, Agent, or Firm*—Finnegan, Henderson, Farabow, Garrett & Dunner, LLP

(57) ABSTRACT

A method for producing an optical element having a multi-layered antireflection film formed on a synthetic resin substrate, in which the antireflection film formed has good heat resistance, and its heat resistance lowers little with time. At least one high-refraction layer of the multi-layered antireflection film contains niobium oxide, zirconium oxide, yttrium oxide, and optionally aluminum oxide. High-refraction layers can be formed within a shorter period of time while not detracting from the good physical properties intrinsic to the layers.

12 Claims, No Drawings

COMPOSITION FOR VAPOR DEPOSITION, METHOD FOR FORMING AN ANTIREFLECTION FILM, AND OPTICAL ELEMENT

The present invention relates to a composition suitable for vapor deposition, to a method for forming an antireflection film, and to an optical element.

BACKGROUND OF THE INVENTION

For improving the surface reflection characteristic of an optical element that comprises a synthetic resin, it is well known to form an antireflection film on the surface of the synthetic resin. For example, Japanese Patent Laid-Open No. 116003/1981 discloses an optical element having an antireflection film formed on a substrate of CR-39 (diethylene glycol bisallyl carbonate) resin, in which the antireflection film comprises a basic layer made of $SiO_2$ having a thickness of 1.5 λ, a first layer made of a two-layered equivalent film constructed of a $ZrO_2$ layer and an $SiO_2$ layer and having an overall thickness of about 0.25 λ, a second layer made of $ZrO_2$ having a thickness of about 0.50 λ and a third layer made of $SiO_2$ having a thickness of about 0.25 λ that are formed in that order on the CR-39 resin substrate.

However, when an antireflection film is formed on a resin substrate through vapor deposition, the temperature resistance of the resin substrate is not as high as that of glass substrates. Therefore, it cannot be said that, for example, the heat resistance of a layer made of $ZrO_2$ formed on a resin substrate through vapor deposition is sufficient. In addition, the heat resistance of the $ZrO_2$ layer is apt to greatly lower with time. Optical elements of which the heat resistance of the antireflection film is not good as a whole and is apt to greatly lower with time, are often problematic in their practical use, for example, for lenses for spectacles. This is because plastic frames of spectacles are heated before lenses are fitted thereinto and the heat is conducted to the lenses having been fitted into the frames. An antireflection film of low heat resistance is often cracked owing to the difference in the thermal expansion, etc.

To solve the problem of heat resistance, for example, Japanese Patent Laid-Open No. 291502/1990 and U.S. Pat. No. 5,181,141 disclose an optical element having an antireflection film of which the high-refraction layer is formed from a vapor deposition film containing $Ta_2O_5$, $ZrO_2$ and $Y_2O_3$, and discloses a composition for vapor deposition to form a vapor deposition film containing $Ta_2O_5$, $ZrO_2$ and $Y_2O_3$.

The composition for vapor deposition disclosed in Japanese Patent Laid-Open No. 291502/1990 and U.S. Pat. No. 5,181,141 containing $Ta_2O_5$, $ZrO_2$ and $Y_2O_3$, requires a relatively long period of time to form the intended antireflection film, and is therefore unfavorable in point of the working efficiency.

Especially in the field of spectacles, desired are new optical elements for plastic lenses coated with an antireflection film of which the heat resistance is good and does not lower with time.

An object of the invention is to provide an optical element that comprises a synthetic resin substrate that must be subjected to vapor deposition thereon at low temperatures and which has an antireflection film formed, and in which the heat resistance of the antireflection film is good and lowers little with time. Another object of the invention is to provide a composition that is suitable for vapor deposition and capable of forming a high-refraction layer within a shorter period of time not detracting from the physical properties intrinsic to the high-refraction layer, and to provide a method for forming an antireflection film.

SUMMARY OF THE INVENTION

According to the present invention, when niobium oxide and optionally aluminum oxide are added to the conventional composition for vapor deposition in addition to zirconium oxide and yttrium oxide, and when the resulting composition is used for forming an antireflection film, a multi-layered antireflection film of good heat resistance can be obtained. Further, the vapor deposition film can be formed within a short period of time.

Specifically, a first aspect of the invention is concerned with a composition, which contains niobium oxide, zirconium oxide, yttrium oxide, and optionally aluminum oxide. A second aspect of the invention is concerned with a method for forming an antireflection film, which comprises sintering a powdery mixture of niobium oxide, zirconium oxide, yttrium oxide, and optionally aluminum oxide, vaporizing the sintered material to form a vapor of the mixed oxide, and depositing the mixed oxide vapor on a substrate. A third aspect of the invention is concerned with an optical element having the antireflection film described above formed on a plastic substrate.

DETAILED DESCRIPTION OF THE INVENTION

The composition of the invention is prepared by sintering a powdery mixture that contains niobium oxide powder, zirconium oxide powder and yttrium oxide powder, preferably a powdery mixture that contains $Nb_2O_5$ powder, $ZrO_2$ powder and $Y_2O_3$ powder, or a powdery mixture that contains $Nb_2O_5$ powder, $ZrO_2$ powder, $Y_2O_3$ powder and $Al_2O_3$ powder. This composition can be formed into a vapor deposition film in a short period of time with high film productivity as compared with a conventional composition for vapor deposition that is prepared by sintering $ZrO_2$ alone.

It is desirable to mix the three components of the invention because pellets of niobium oxide alone often cause a problem of splashes when heated with an electronic gun. If splashed, fine particles are often attached to lens substrates, thereby causing failed products. In addition, the thin film is liable to be colored (absorbed). To improve the tendency that the chemical resistance such as acid resistance and alkali resistance is weak, a plurality of components are mixed.

The addition of zirconium oxide ($ZrO_2$) is effective for reducing splashes which are often seen in vapor deposition of pellets of niobium oxide alone heated with an electronic gun and which cause the film to peel off and cause adhesion of impurities, and therefore, is favorable for obtaining films for vapor deposition of stable quality.

The addition of yttrium oxide ($Y_2O_3$) acts to vary the oxide condition of the thin film formed through vapor deposition under heat with an electronic gun. It is effective for preventing the film from coloration (absorption) occurred in the thin films formed through vapor deposition of pellets of niobium oxide alone or of pellets of a mixture of niobium oxide and zirconium oxide.

According to the invention, the above-mentioned three components that are mixed to form the composition for vapor deposition all exhibit their individual effects. In addition, the heat resistance of the antireflection film as formed lowers little with time. A preferred blend ratio in the composition for vapor deposition is as follows. It is preferred that based on the total amount of the composition for vapor deposition, the amount of niobium oxide (calculated in terms of $Nb_2O_5$) is from 60 to 90% by weight, more preferably from 80 to 90% by weight, that of zirconium oxide (calculated in terms of $ZrO_2$) is from 5 to 20% by weight, more preferably from 5 to 10% by weight, and that of yttrium oxide (calculated in terms of $Y_2O_3$) is from 5 to 35% by weight, more preferably from 5 to 10% by weight. If the amount of $Nb_2O_5$ and/or the amount of $ZrO_2$ and/or that of $Y_2O_3$ are within the preferred ranges, the obtained high-refraction layer will exhibit particularly beneficial absorption characteristics; an amount of $Y_2O_3$ above 50% by weight will furthermore lead to improved acid resistance of the obtained antireflection film.

The composition for vapor deposition may furthermore contain aluminum oxide so as to control the refractivity. According to this embodiment, the amount of aluminum oxide (in terms of $Al_2O_3$) is preferably from 0.3 to 7.5% by weight, more preferably from 0.3 to 2.0% by weight, of the total of $Nb_2O_5$, $ZrO_2$ and $Y_2O_3$. An amount of aluminum oxide above the lower limit of the preferred range will lead to most satisfactory results in controlling the refractivity; an aluminum oxide content of not more than the upper limit of the preferred range will result in a particularly good alkali resistance of the obtained antireflection film. Not interfering with the characteristics of the layer that are induced by $Nb_2O_5$, $ZrO_2$ and $Y_2O_3$, aluminum oxide ($Al_2O_3$) can well control the refractivity of the layer, and an amount within the preferred range will prove to be particularly beneficial in this respect.

The composition for vapor deposition of the invention may further contain any other metal oxides such as tantalum oxide ($Ta_2O_5$), titanium oxide ($TiO_2$) and the like not detracting from the above-mentioned effects. The amount of the any other metal oxides preferably does not exceed 30 wt. %, more preferably 10 wt. %, on the basis of the total composition.

For the low-refraction layer of the multi-layered antireflection film of the invention, for example, a silicon dioxide ($SiO_2$) film may be used to take advantage of its heat resistance.

The antireflection film may have a layered configuration that includes a two-layered film of $\lambda/4$-$/4$, and a three-layered film of $\lambda/4$-$\lambda/4$-$\lambda/4$ or $/\lambda4$-$\lambda/2$-$\lambda/4$. In the context of the present application, $\lambda$ has a value in the range of from 450 to 550 nm. In practice, a typical value of $\lambda$ is 500 nm. The antireflection film may also be any other four-layered or multi-layered film. The first low-refraction layer nearest to the substrate may be any of known two-layered equivalent films, three-layered equivalent films or other composite films.

The antireflection film may be of any suitable thickness. In general, the thickness ranges from 300 nm to 1000 nm depending on its configuration and composition content. The thicknesses described in the examples are representative and should not be regarded as limiting.

For the synthetic resin substrate used for the optical element of the invention, for example, usable are methyl methacrylate homopolymers, copolymers of methyl methacrylate and one or more other monomers such as monomers having acryl group or vinyl group as monomer components, diethylene glycol bisallyl carbonate homopolymers, copolymers of diethylene glycol bisallyl carbonate and one or more other monomers such as monomers having acryl group or vinyl group as monomer components, sulfur-containing copolymers, halogen-containing copolymers, polycarbonates, polystyrenes, polyvinyl chlorides, unsaturated polyesters, polyethylene terephthalates, polyurethanes, etc.

For forming an antireflection film on a synthetic resin in the invention, it is desirable that a hard coat layer containing an organosilicon polymer is first formed on the synthetic resin surface. The hard coat layer may be formed by any suitable method such as dipping, spin coating or the like, and thereafter the antireflection film is formed on the hard coat layer. Typical compositions and coating methods for the hard coat layer are disclosed in U.S. Pat. No. 6,306,513 issued Oct. 23, 2001. For improving the adhesiveness between the synthetic resin substrate and the antireflection film, the scratch resistance, etc., it is desirable to dispose a basic layer between the synthetic resin surface and the antireflection film or between the hard coat layer formed on the synthetic resin substrate and the antireflection film. The basic layer may be, for example, a vapor deposition film of silicon oxide or the like. Suitable basic layers are disclosed in U.S. Pat. No. 5,181,141.

According to the invention, preferred compositions comprise three-component compositions consisting of niobium oxide, zirconium oxide and yttrium oxide, as well as four component compositions consisting of niobium oxide, zirconium oxide, yttrium oxide and aluminum oxide. It is desirable that the composition of the invention be formed by mixing a powder of niobium oxide ($Nb_2O_5$), a powder of zirconium oxide ($ZrO_2$) and a powder of yttrium oxide ($Y_2O_3$), optionally, a powder of aluminum oxide ($Al_2O_3$), and optionally powders of other metal oxides (these mixed powders may sometimes be hereinafter referred to as powdery mixtures), pressing the powdery mixture, followed by heating, for example, with electronic beams, to thereby deposit the vapor of the mixed oxides on a substrate. The use of a sintered material in a pellet form prepared by pressing and sintering is preferable because the vapor deposition time can be reduced. The amount of each oxide in the powdery mixture or in the sintered pellets may be properly varied, depending on the desired properties of the high-refraction layer to be formed.

As mentioned hereinabove, an antireflection film according to the invention may be formed by sintering the powdery mixture comprising powders of niobium oxide, zirconium oxide, yttrium oxide and, optionally, aluminum oxide and, optionally, other metal oxides, generating a vapor of the mixed oxide, and depositing the generated vapor on a substrate. Preferably, the process of forming the antireflection film is combined with an ion-assisted process. Such ion-assisted processes are described in M.Flindner et al., Society of Vacuum Coaters Albuquerque, N.Mex., USA.p237–241, 1995 as well as from the documents cited therein.

Combined with an ion-assisted process, the film formation produces various advantages. Concretely, when the high-refraction layer is formed through vapor deposition assisted by oxygen ions, the absorption of the lenses can be reduced further. While any suitable gas can be employed, when an ion-assisted process using a mixed gas of oxygen and argon is employed, the alkali resistance is improved. Preferably, the mixed gas comprises from 90 to 95% of oxygen gas and from 5 to 10% of argon gas. If the amount of the oxygen gas is too small, the films formed may possibly not keep the optical properties. With a suitable amount of argon gas, the film density can be increased.

In order to obtain the composition for vapor deposition, the powdery mixture may be pressed in any conventional method. Preferably, for example, it is pressed under a pressure of from 200 kg/cm2 to 400 kg/cm2 (from 19.6 to 39.2 MPa). The sintering temperature varies depending on the composition of the constituent components, etc., but may be in the range of, for example, from 1000 to 1400° C. The sintering time varies depending on the sintering temperature, etc., but may be generally in the range of from 1 to 48 hours.

The high-refraction films in the invention may be formed by vaporizing the composition for vapor deposition as defined above using any method of vacuum evaporation, sputtering, ion plating or the like under ordinary conditions. These conventional methods are described in more detail in Handbook of Thin Film Technology Edited by Leon I. Maissel and Reinhand Glang. That is, a vapor of the mixed oxide of the composition is generated from the composition for vapor deposition and the resulting vapor is deposited on a substrate. The temperature of the synthetic resin substrate to be heated varies depending on the heat resistance of the synthetic resin, but may be in the range of, for example, from 70 to 85° C.

According to the method of the invention, even in the case where the film formation must be carried out at a low temperature ranging from 70 to 85° C. in terms of the heating temperature of the substrate at vaporization as in synthetic resin substrates, the antireflection film having good heat resistance, the heat resistance of which is hardly lowered with time, can be obtained. The optical element having an antireflection film of the invention may be used not only for lenses for spectacles but also for lenses for cameras, windshields for automobiles, optical filters to be fitted to displays of word processors, etc.

EXAMPLES

The invention is described in detail with reference to the following Examples. The physical properties of the optical elements having an antireflection film produced in the following Examples and Comparative Examples were measured according to the test methods mentioned below.

(1) Melt condition of composition for vapor deposition:

The melt condition was checked according to the following criteria:

UA: Not splashed.
A: Splashed a little.
B: Splashed frequently.
C: Always splashed.

In the context of the present invention, "splashing" is evaluated by the surface condition of the sintered composition, after finishing vapor deposition. In the case of not splashed, the surface condition of the sintered composition is smooth. In the case of splashed, cavities are seen on the surface condition of the sintered composition.

(2) Attachment condition of fine foreign materials:

After finishing vapor deposition, the state of attachment condition of fine particles on a lens surface in vapor deposition by splashing was checked by means of naked eyes and evaluated according to the following criteria:

UA: No fine foreign materials found.
A: 1 to 5 fine foreign materials found.
B: 6 to 10 fine foreign materials found.
C: 11 or more fine foreign materials found.

(3) Alkali resistance test:

Lenses were dipped in an aqueous 10 wt % NaOH solution of a temperature of 20° C. After 30 minutes and 60 minutes, they were checked as to whether or not the coating film had been peeled, and as to whether or not the lens surface had been roughened.

UA: Few peeled dots are found.
A: Small peeled dots of at most 0.1 mm in size were found on the entire surface, or a few peeled dots of around 0.3 mm in diameter were found.
B: The density of peeled dots was higher than in the rank A, and the proportion of larger peeled dots was higher than in the rank A.
C: Peeled dots of around 0.3 mm in size were found everywhere on the surface, or the density of small peeled dots was high.
D: A lot of peeled dots were found everywhere on the surface, and the surface looked white. All the others inferior to those samples are in the rank D.

(4) Scratch resistance test:

The surface was rubbed with steel wool of #0000 and under a weight of 1 kg being applied thereto. After 20 strokes of rubbing, the surface condition was checked according to the following criteria:

UA: Scratched little
A: Scratched slightly.
B: Much scratched.
C: Coating film swollen.

(5) Adhesiveness test:

According to JIS-Z-1522, the surface was cut to have 10×10 cross-cuts, and tested three times for cross-cut peeling with an adhesive tape, Cellotape(Trade Name, Produced by Nichiban Corp.). The number of the remaining cross-cuts was counted.

(6) Luminous Reflectance:

Using a spectrophotometer, U-3410 made by Hitachi, Ltd., the luminous reflectance was measured.

(7) Luminous transmittance:

Using a spectrophotometer, U-3410 made by Hitachi, Ltd., the luminous transmittance was measured.

(8) Absorbance:

The absorbance was obtained by subtracting the luminous reflectance and the luminous transmittance from 100%.

(9) Heat resistance test:

An optical element having an antireflection film immediately after forming a vapor deposition film was heated in an oven for 1 hour, and checked as to whether it was cracked or not. Concretely, it was heated first at 50° C. over a period of 60 minutes, and the temperature was elevated at intervals of 5° C. (of a duration of 30 minutes for each interval), and the temperature at which it was cracked was read.

Further, an optical element having an antireflection film immediately after forming a vapor deposition film for the heat resistance test with time was exposed to the open air for 2 months, and thereafter subjected to the same heat resistance test and evaluated as above.

Example 1, Example 4, Comparative Example 1 and Comparative Example 4

For the synthetic resin substrate to be coated with an antireflection film, prepared was a plastic lens (CR-39: substrate A) made of diethylene glycol bisallyl carbonate as a major component and containing a UV absorbent, 2-hydroxy-4-n-octoxybenzophenone in a ratio by weight of the former to the latter of 99.97/0.03, and having a refractive index of 1.499.

Formation of Hard Coat Layer (nd 1.50)

The plastic lens was dipped in a coating solution containing 80 mol % of colloidal silica and 20 mol % of γ-glycidoxypropyltrimethoxysilane, and cured to form a hard coat layer A thereon.

In Example 1, the plastic lens with the hard coat layer formed thereon was heated at 80° C., and a basic layer made of $SiO_2$ (having a refractive index of 1.46 and a thickness of 0.4875 λ (λ=500 nm)) was formed on the hard coat layer through vacuum evaporation (in vacuum of $2 \times 10^{-5}$ Torr). Next, a layer (having a refractive index of 2.12 and a thickness of 0.0502 λ) was formed thereon by heating a three-component composition A for vapor deposition ($Nb_2O_5$:$ZrO_2$:$Y_2O_3$=76:16.6:7.4% by weight) prepared by mixing powder of $Nb_2O_5$, powder of $ZrO_2$ and powder of $Y_2O_3$, pressing the resulting mixture under a pressure of 300 kg/cm², and sintering it at a temperature of 1300° C. under heat with an electronic gun at an output current of 170 mA; and a first low-refraction layer made of $SiO_2$ (having a refractive index of 1.46 and a thickness of 0.0764 λ) was further formed thereon. On the first low-refraction layer, formed was a high-refraction layer (having a refractive index of 2.12 and a thickness of 0.4952 λ) with the composition A for vapor deposition; and a second low-refraction layer made of $SiO_2$ (having a refractive index of 1.46 and a thickness of 0.2372 λ) was further formed thereon, to obtain the plastic lens having an antireflection film. The low-refraction layers and the high-refraction layers were formed all in the same manner of vacuum evaporation as that for the basic layer.

In Example 4, an antireflection film was formed in the same manner of vacuum evaporation for which a composition B for vapor deposition prepared by adding 1% by weight of $Al_2O_3$ to the composition A for vapor deposition was used for forming the high-refraction layers.

In Comparative Example 1, a conventional vapor source of $ZrO_2$ was used for forming the high-refraction layers of the antireflection film to coat the plastic lens; and in Comparative Example 4, a vapor source of niobium oxide alone was used for forming them.

Example 2, Example 5, Comparative Example 2 and Comparative Example 5

142 parts by weight of an organosilicon compound, γ-glycidoxypropylmethoxysilane was put into a glass container, to which were dropwise added 1.4 parts by weight of 0.01 N hydrochloric acid and 32 parts by weight of water with stirring. After the dropwise addition, this was stirred for 24 hours to obtain a solution of hydrolyzed γ-glycidoxypropyltrimethoxysilane. To the solution, added were 460 parts by weight of stannic oxide-zirconium oxide composite sol (dispersed in methanol, having a total metal oxide content of 31.5% by weight and having a mean particle size of from 10 to 15 nm), 300 parts by weight of ethyl cellosolve, 0.7 parts by weight of a lubricant, silicone surfactant, and 8 parts by weight of a curing agent, aluminum acetylacetonate. The mixture was stirred well and subsequently filtered to prepare a coating solution.

Formation of Hard Coat Layer

A plastic lens substrate (a plastic lens for spectacles made by Hoya Corporation, EYAS (a trade name) having a refractive index of 1.60—substrate B) was pretreated with an aqueous alkali solution, and dipped in the coating solution. After having been thus dipped therein, this was taken out at a pulling rate of 20 cm/min. Then, the plastic lens was heated at 120° C. for 2 hours to form a hard coat layer B.

Next, as indicated in the Table below, a 5-layered antireflection film was formed to produce plastic lenses, for which the composition A for vapor deposition was used for forming the 2nd and 4th high-refraction layers in Example 2; the composition B for vapor deposition was used for forming the antireflection film in Example 5; a conventional vapor source of $ZrO_2$ was used for forming the antireflection film in Comparative Example 2; and a vapor source of niobium oxide alone was used for forming the antireflection film in Comparative Example 5.

Example 3, Example 6, Comparative Example 3 and Comparative Example 6

100 parts by weight of an organosilicon compound, γ-glycidoxypropyltrimethoxysilane, was put into a glass container, to which were added 1.4 parts by weight of 0.01 N hydrochloric acid and 23 parts by weight of water with stirring. After the addition, this was stirred for 24 hours to obtain a solution of hydrolyzed γ-glycidoxypropyltrimethoxysilane. On the other hand, 200 parts by weight of an inorganic particulate substance, composite sol of particulates made of titanium oxide, zirconium oxide and silicon oxide as major components (dispersed in methanol, having a total solid content of 20% by weight and having a mean particle size of from 5 to 15 nm—in this, the atomic ratio of Ti/Si in the core particles is 10, and the ratio by weight of the shell to the core is 0.25, this sol can be prepared according to Japanese Patent Laid-Open No.270620/1988) was mixed with 100 parts by weight of ethyl cellosolve, 0.5 parts by weight of a lubricant, silicone surfactant, and 3.0 parts by weight of a curing agent, aluminum acetylacetonate. The resulting mixture was added to the hydrolyzed γ-glycidoxypropyltrimethoxysilane, and stirred well. This was filtered to prepare a coating solution.

Formation of Hard Coat Layer

A plastic lens substrate (a plastic lens for spectacles made by Hoya Corporation, Teslalid (a trade name), having a refractive index of 1.71—substrate C) was pretreated with an aqueous alkali solution, and dipped in the coating solution. After having been thus dipped therein, this was taken out at a pulling rate of 20 cm/min. Then, the plastic lens was heated at 120° C. for 2 hours to form a hard coat layer C.

Next, as indicated in the Table below, a 7-layered antireflection film was formed to produce plastic lenses, for which the composition A for vapor deposition was used for forming the 2nd, 4th and 6th high-refraction layers in Example 3; the composition B for vapor deposition was used for forming the antireflection film in Example 6; a conventional vapor source of $ZrO_2$ was used for forming the antireflection film in Comparative Example 3; and a vapor source of niobium oxide alone was used for forming the antireflection film in Comparative Example 6.

Table 1 shows the plastic lens substrates, the hard coat layers, the composition for vapor deposition and the thickness of the constituent layers of the antireflection films, and the data of the physical properties in Examples and Comparative Examples.

In all Examples and in Comparative Examples 4 to 6 in which niobium oxide alone was used for forming the high-refraction layer of the antireflection film, the substrates were pretreated with ions, and the formation of the high-refraction layer was assisted by ions. Concretely, both in the ion-pretreatment and in the ion-assisted process, oxygen gas was used. In the ion-pretreatment, the accelerating voltage was 150 V, the current was 100 mA, and the exposure time was 60 seconds; and in the ion-assisted process, the accelerating voltage was 100 V, and the accelerating current was 20 mA.

In Comparative Examples 1 to 3 in which a conventional vapor source of $ZrO_2$ was used for forming the high-refraction layer of the antireflection film, the substrate was not pretreated with ions, and the formation of the high-refraction layer was not assisted by ions.

TABLE 1

|  |  | Example 1 | Example 2 | Example 3 | Example 4 | Example 5 | Example 6 |
|---|---|---|---|---|---|---|---|
| Plastic lens substrate | | Substrate A | Substrate B | Substrate C | Substrate A | Substrate B | Substrate C |
| Hard coat layer | | Layer A | Layer B | Layer C | Layer A | Layer B | Layer C |
| 1st Layer | Composition for vapor deposition | $SiO_2$ | $SiO_2$ | $SiO_2$ | $SiO_2$ | $SiO_2$ | $SiO_2$ |
| | Thickness ($\lambda$) | 0.4875 | 0.0947 | 0.0908 | 0.3871 | 0.0426 | 0.0727 |
| 2nd Layer | Composition for vapor deposition | Composition A | Composition A | Composition A | Composition B | Composition B | Composition B |
| | Thickness ($\lambda$) | 0.0502 | 0.0348 | 4044 | 0.052 | 0.0498 | 0.0226 |
| 3rd Layer | Composition for vapor deposition | $SiO_2$ | $SiO_2$ | $SiO_2$ | $SiO_2$ | $SiO_2$ | $SiO_2$ |
| | Thickness ($\lambda$) | 0.0764 | 0.5839 | 0.5839 | 0.022 | 0.0227 | 0.033 |
| 4th Layer | Composition for vapor deposition | Composition A | Composition A | Composition A | Composition B | Composition B | Composition B |
| | Thickness ($\lambda$) | 0.4952 | 0.132 | 0.5809 | 0.5204 | 0.5004 | 0.5402 |
| 5th Layer | Composition for vapor deposition | $SiO_2$ | $SiO_2$ | $SiO_2$ | $SiO_2$ | $SiO_2$ | $SiO_2$ |
| | Thickness ($\lambda$) | 0.2372 | 0.0691 | 0.1297 | 0.2572 | 0.0781 | 0.1097 |
| 6th Layer | Composition for vapor deposition | | | Composition A | | | Composition B |
| | Thickness ($\lambda$) | | | 0.1747 | | | 0.0226 |
| 7th Layer | Composition for vapor deposition | | | $SiO_2$ | | | $SiO_2$ |
| | Thickness ($\lambda$) | | | 0.2853 | | | 0.2527 |
| Melt condition of composition for vapor deposition | | UA | UA | UA | UA | UA | UA |
| Attachment of fine particles | | UA | UA | UA | UA | UA | UA |
| Alkali resistance | | UA | UA | UA | UA | UA | UA |
| Scratch resistance | | UA | UA | UA | UA | UA | UA |
| Film adhesiveness | | 100 | 100 | 100 | 100 | 100 | 100 |
| Luminous reflectance Y (%) | | 0.458 | 0.48 | 0.5 | 0.476 | 0.561 | 0.486 |
| Luminous transmittance Z (%) | | 99.01 | 99.223 | 99.289 | 99.002 | 99.23 | 99.301 |
| Absorbance, 100-Y-Z (%) | | 0.532 | 0.297 | 0.211 | 0.522 | 0.209 | 0.213 |
| Heat resistance (° C.) | | 100 | 100 | 100 | 100 | 100 | 100 |
| Heat resistance (° C.) after exposure to the open air for 2 months | | 85 | 85 | 85 | 80 | 80 | 80 |

TABLE 2

|  |  | Comp. Example 1 | Comp. Example 2 | Comp. Example 3 | Comp. Example 4 | Comp. Example 5 | Comp. Example 6 |
|---|---|---|---|---|---|---|---|
| Plastic lens substrate | | Substrate A | Substrate B | Substrate C | Substrate A | Substrate B | Substrate C |
| Hard coat layer | | Layer A | Layer B | Layer C | Layer A | Layer B | Layer C |
| 1st Layer | Composition for vapor deposition | $SiO_2$ | $SiO_2$ | $SiO_2$ | $SiO_2$ | $SiO_2$ | $SiO_2$ |
| | Thickness ($\lambda$) | 1.2444 | 0.3625 | 0.561 | 0.3871 | 0.0426 | 0.0727 |
| 2nd Layer | Composition for vapor deposition | $ZrO_2$ | $ZrO_2$ | $ZrO_2$ | $Nb_2O_5$ | $Nb_2O_5$ | $Nb_2O_5$ |
| | Thickness ($\lambda$) | 0.0635 | 0.0636 | 0.0637 | 0.0518 | 0.0598 | 0.0126 |
| 3rd Layer | Composition for vapor deposition | $SiO_2$ | $SiO_2$ | $SiO_2$ | $SiO_2$ | $SiO_2$ | $SiO_2$ |
| | Thickness ($\lambda$) | 0.0587 | 0.0588 | 0.0589 | 0.022 | 0.0227 | 0.033 |
| 4th Layer | Composition for vapor deposition | $ZrO_2$ | $ZrO_2$ | $ZrO_2$ | $Nb_2O_5$ | $Nb_2O_5$ | $Nb_2O_5$ |
| | Thickness ($\lambda$) | 0.4204 | 0.4205 | 0.4206 | 0.5129 | 0.5044 | 0.5329 |
| 5th Layer | Composition for vapor deposition | $SiO_2$ | $SiO_2$ | $SiO_2$ | $SiO_2$ | $SiO_2$ | $SiO_2$ |
| | Thickness ($\lambda$) | 0.253 | 0.2531 | 0.2832 | 0.2572 | 0.0781 | 0.1097 |
| 6th Layer | Composition for vapor deposition | | | $ZrO_2$ | | | $Nb_2O_5$ |
| | Thickness ($\lambda$) | | | 0.4206 | | | 0.0526 |
| 7th Layer | Composition for vapor deposition | | | $SiO_2$ | | | $SiO_2$ |
| | Thickness ($\lambda$) | | | 0.253 | | | 0.2527 |
| Melt condition of composition for vapor deposition | | UA | UA | UA | B | B | B |
| Attachment of fine particles | | UA | UA | UA | B | B | B |
| Alkali resistance | | UA to A | UA | UA | UA to A | UA to A | A |
| Scratch resistance | | UA to A | UA | UA | UA | UA | UA |
| Film adhesiveness | | 98 | 99 | 98 | 100 | 100 | 100 |
| Luminous reflectance Y (%) | | 0.476 | 0.476 | 0.476 | 1.025 | 1.442 | 1.352 |
| Luminous transmittance Z (%) | | 99.002 | 99.002 | 99.002 | 97.568 | 96.89 | 97.063 |
| Absorbance, 100-Y-Z (%) | | 0.522 | 0.522 | 0.522 | 1.407 | 1.668 | 1.585 |
| Heat resistance (° C.) | | 85 | 85 | 85 | 85 | 85 | 85 |
| Heat resistance (° C.) after exposure to the open air for 2 months | | 50 | 50 | 60 | 80 | 80 | 80 |

As indicated in Table 1, the compositions A and B for vapor deposition of the invention used in Examples 1 to 6 were prevented from splashing, and stably deposited. Accordingly, attachment of fine particles by splashing was not found on the lens surface, and an excellent thin optical film was obtained.

Also as in Table 1, the antireflection film-coated plastic lenses of Examples 1 to 6 in which was used any of the composition A or B for vapor deposition of the invention all had better heat resistance as compared with the antireflection film-coated plastic lenses obtained in Comparative Examples 1 to 6 (reported in Table 2), and their heat resistance lowered little with time.

Example 7 to Example 18

In the same manner as in Examples 1 to 6 but not assisted by ions, an antireflection film was formed under the conditions as in Table 3 and Table 4, and tested for their properties. Though not assisted by ions, good physical properties were obtained as reported in Table 3 and Table 4.

In the Tables, $\lambda$ indicates the wavelength of the light applied, and $\lambda$=500 nm.

TABLE 3

|  |  | Example 7 | Example 8 | Example 9 | Example 10 | Example 11 | Example 12 |
|---|---|---|---|---|---|---|---|
| Plastic lens substrate | | Substrate A | Substrate B | Substrate C | Substrate A | Substrate B | Substrate C |
| Hard coat layer | | Layer A | Layer B | Layer C | Layer A | Layer B | Layer C |
| 1st Layer | Composition for vapor deposition | $SiO_2$ | $SiO_2$ | $SiO_2$ | $SiO_2$ | $SiO_2$ | $SiO_2$ |
| | Thickness ($\lambda$) | 0.0971 | 0.4728 | 0.0843 | 0.0501 | 0.4728 | 0.0843 |
| 2nd Layer | Composition for vapor deposition | Composition A | Composition A | Composition A | Composition B | Composition B | Composition B |
| | Thickness ($\lambda$) | 0.01 | 0.0759 | 0.0379 | 0.0382 | 0.0759 | 0.0379 |
| 3rd Layer | Composition for vapor deposition | $SiO_2$ | $SiO_2$ | $SiO_2$ | $SiO_2$ | $SiO_2$ | $SiO_2$ |
| | Thickness ($\lambda$) | 0.5783 | 0.0455 | 0.5031 | 0.6107 | 0.0455 | 0.5031 |
| 4th Layer | Composition for vapor deposition | Composition A | Composition A | Composition A | Composition B | Composition B | Composition B |
| | Thickness ($\lambda$) | 0.0533 | 0.4209 | 0.065 | 0.0625 | 0.4209 | 0.065 |
| 5th Layer | Composition for vapor deposition | $SiO_2$ | $SiO_2$ | $SiO_2$ | $SiO_2$ | $SiO_2$ | $SiO_2$ |
| | Thickness ($\lambda$) | 0.0681 | 0.2315 | 0.0456 | 0.072 | 0.2315 | 0.0456 |
| 6th Layer | Composition for vapor deposition | Composition A | | Composition A | Composition B | | Composition B |
| | Thickness ($\lambda$) | 0.4777 | | 0.4362 | 0.5104 | | 0.4362 |
| 7th Layer | Composition for vapor deposition | $SiO_2$ | | $SiO_2$ | $SiO_2$ | | $SiO_2$ |
| | Thickness ($\lambda$) | 0.2365 | | 0.2347 | 0.2511 | | 0.2347 |
| Melt condition of composition for vapor deposition | | UA | UA | UA | UA | UA | UA |
| Attachment of fine particles | | UA | UA | UA | UA | UA | UA |
| Alkali resistance | | UA | UA | UA | UA | UA | UA |
| Scratch resistance | | UA | UA | UA | UA | UA | UA |
| Film adhesiveness | | 100 | 100 | 100 | 100 | 100 | 100 |
| Luminous reflectance Y (%) | | 0.86 | 0.85 | 0.86 | 0.86 | 0.85 | 0.86 |
| Luminous transmittance Z (%) | | 99.01 | 99.01 | 99 | 99.002 | 99.02 | 99 |
| Absorbance, 100-Y-Z (%) | | 0.13 | 0.14 | 0.14 | 0.138 | 0.13 | 0.14 |
| Heat resistance (° C.) | | 100 | 100 | 100 | 100 | 100 | 100 |
| Heat resistance (° C.) after exposure to the open air for 2 months | | 85 | 85 | 85 | 85 | 85 | 85 |

TABLE 4

|  |  | Example 13 | Example 14 | Example 15 | Example 16 | Example 17 | Example 18 |
|---|---|---|---|---|---|---|---|
| Plastic lens substrate | | Substrate A | Substrate B | Substrate C | Substrate A | Substrate B | Substrate C |
| Hard coat layer | | Layer A | Layer B | Layer C | Layer A | Layer B | Layer C |
| 1st Layer | Composition for vapor deposition | $SiO_2$ | $SiO_2$ | $SiO_2$ | $SiO_2$ | $SiO_2$ | $SiO_2$ |
| | Thickness ($\lambda$) | 0.459 | 0.4568 | 0.0698 | 0.801 | 0.6121 | 0.1123 |
| 2nd Layer | Composition for vapor deposition | Composition A | Composition A | Composition A | Composition A | Composition A | Composition A |
| | Thickness ($\lambda$) | 0.0458 | 0.0549 | 0.0407 | 0.032 | 0.0465 | 0.0287 |
| 3rd Layer | Composition for vapor deposition | $SiO_2$ | $SiO_2$ | $SiO_2$ | $SiO_2$ | $SiO_2$ | $SiO_2$ |
| | Thickness ($\lambda$) | 0.0809 | 0.0671 | 0.5275 | 0.102 | 0.1004 | 0.5762 |
| 4th Layer | Composition for vapor deposition | Composition A | Composition A | Composition A | Composition A | Composition A | Composition A |
| | Thickness ($\lambda$) | 0.14 | 0.1194 | 0.1179 | 0.143 | 0.16 | 0.1035 |
| 5th Layer | Composition for vapor deposition | $SiO_2$ | $SiO_2$ | $SiO_2$ | $SiO_2$ | $SiO_2$ | $SiO_2$ |
| | Thickness ($\lambda$) | 0.0597 | 0.0543 | 0.0873 | 0.0584 | 0.0519 | 0.1017 |
| 6th Layer | Composition for vapor deposition | Composition A | Composition A | Composition A | Composition A | Composition A | Composition A |
| | Thickness ($\lambda$) | 0.172 | 0.1658 | 0.1731 | 0.1603 | 0.1685 | 0.1484 |
| 7th Layer | Composition for vapor deposition | $SiO_2$ | $SiO_2$ | $SiO_2$ | $SiO_2$ | $SiO_2$ | $SiO_2$ |
| | Thickness ($\lambda$) | 0.2795 | 0.2673 | 0.2839 | 0.287 | 0.2911 | 0.309 |
| Melt condition of composition for vapor deposition | | UA | UA | UA | UA | UA | UA |
| Attachment of fine particles | | UA | UA | UA | UA | UA | UA |
| Alkali resistance | | UA | UA | UA | UA | UA | UA |
| Scratch resistance | | UA | UA | UA | UA | UA | UA |
| Film adhesiveness | | 100 | 100 | 100 | 100 | 100 | 100 |
| Luminous reflectance Y (%) | | 0.84 | 0.84 | 0.92 | 0.8 | 1.02 | 1.05 |
| Luminous transmittance Z (%) | | 99.01 | 99 | 98.9 | 99 | 98.74 | 98.7 |

TABLE 4-continued

|  | Example 13 | Example 14 | Example 15 | Example 16 | Example 17 | Example 18 |
|---|---|---|---|---|---|---|
| Absorbance, 100-Y-Z (%) | 0.15 | 0.16 | 0.18 | 0.2 | 0.24 | 0.25 |
| Heat resistance (° C.) | 100 | 110 | 100 | 100 | 110 | 100 |
| Heat resistance (° C.) after exposure to the open air for 2 months | 85 | 95 | 85 | 85 | 95 | 85 |

Composition A and Composition B in the Tables above mean that the layer was formed of the composition A or the composition B.

The inventive examples of the present application describe preferred embodiments of the present invention. However, compositions having compositional ratios between the compositions of the examples are also preferred. Similarly, antireflection films having thicknesses between those disclosed in the examples are also preferred. Finally, optical elements, having layer structures between those disclosed in the examples are also preferred.

As is obvious from the above-mentioned Examples, the invention has made it possible to obtain an optical element having an antireflection film and having good heat resistance, which lowers little with time, even on a synthetic resin substrate that must be processed at low temperatures for vapor deposition thereon.

In addition, using the composition of the invention and according to the method for forming an antireflection film of the invention, high-refraction layers can be formed within a shorter period of time, and the good physical properties intrinsic thereto are not diminished at all. The composition and the method of the invention ensure high working efficiency.

The invention claimed is:

1. A composition comprising from 60 to 90% by weight of niobium oxide (calculated in terms of $Nb_2O_5$), from 5 to 20% by weight of zirconium oxide (calculated in terms of $ZrO_2$), and from 5 to 35% by weight of yttrium oxide (calculated in terms of $Y_2O_3$) based on the total amount of the composition.

2. The composition according to claim 1 additionally comprising aluminum oxide.

3. The composition according to claim 2, wherein the aluminum oxide content (calculated in terms of $Al_2O_3$) is from 0.3 to 7.5% by weight of the total of niobium oxide, zirconium oxide and yttrium oxide.

4. A method for forming an antireflection film comprising sintering the composition of claims 1 or 3, vaporizing the resulting oxide, and depositing the vapor on a substrate.

5. The method according to claim 4, wherein the substrate is a plastic substrate.

6. The method according to claim 5, wherein the plastic substrate has one or more coating layers.

7. The method according to claim 5, which is combined with an ion-assisted process.

8. An antireflection film comprising, in an alternating fashion, at least one layer of silicon dioxide and at least one layer obtainable according to the method of claim 7.

9. An optical element comprising a hard coat layer on a plastic substrate and an antireflection film of claim 8.

10. An antireflection film comprising, in an alternating fashion, at least one layer of silicon dioxide and at least one layer obtainable according to the method of claim 4.

11. An optical element comprising a hard coat layer on a plastic substrate and an antireflection film of claim 10.

12. An optical element according to claim 11 selected from a lens for spectacles, lens for a camera, windshield for an automobile, and an optical filter to be fitted to a display of a word processor.

* * * * *